(12) United States Patent
Beneditz et al.

(10) Patent No.: US 7,453,678 B2
(45) Date of Patent: Nov. 18, 2008

(54) POWER INTERRUPTION SYSTEM FOR ELECTRONIC CIRCUIT BREAKER

(75) Inventors: Bruce D. Beneditz, Roscoe, IL (US); Donald G. Kilroy, Rockford, IL (US)

(73) Assignee: Hamilton Sunstrand Corporation, Rockford, IL (US)

( * ) Notice: Subject to any disclaimer, the term of this patent is extended or adjusted under 35 U.S.C. 154(b) by 400 days.

(21) Appl. No.: 10/924,549

(22) Filed: Aug. 24, 2004

(65) Prior Publication Data

US 2006/0044723 A1 Mar. 2, 2006

(51) Int. Cl.
*H02H 9/02* (2006.01)
(52) U.S. Cl. .................................... 361/93.2
(58) Field of Classification Search ............... 361/93.2, 361/93.1
See application file for complete search history.

(56) References Cited

U.S. PATENT DOCUMENTS

| | | | | |
|---|---|---|---|---|
| 3,582,220 A * | 6/1971 | Nobusawa | ............... | 356/226 |
| 3,886,932 A * | 6/1975 | Suessmilch | ............... | 600/508 |
| 3,889,133 A * | 6/1975 | Oka et al. | ............... | 327/429 |
| 3,915,512 A * | 10/1975 | Chabala | ............... | 303/122.04 |
| 4,575,662 A * | 3/1986 | Lehnhoff | ............... | 318/282 |
| 4,716,463 A * | 12/1987 | Stacy et al. | ............... | 348/730 |
| 4,796,290 A * | 1/1989 | Perry | ............... | 379/27.01 |
| 5,073,930 A * | 12/1991 | Green et al. | ............... | 725/69 |
| 5,138,186 A * | 8/1992 | Dumbovic | ............... | 327/91 |
| 5,285,452 A * | 2/1994 | Wee et al. | ............... | 714/22 |
| 5,428,252 A * | 6/1995 | Walker et al. | ............... | 307/64 |
| 5,847,698 A * | 12/1998 | Reavey et al. | ............... | 345/173 |
| 6,274,949 B1 * | 8/2001 | Lioux et al. | ............... | 307/64 |
| 6,633,189 B1 * | 10/2003 | Gradinariu et al. | ............... | 327/262 |
| 2002/0080544 A1 * | 6/2002 | Pellegrino | ............... | 361/93.9 |
| 2002/0171295 A1 * | 11/2002 | Nitta et al. | ............... | 307/64 |

FOREIGN PATENT DOCUMENTS

JP 05344716 A * 12/1993

* cited by examiner

*Primary Examiner*—Michael J Sherry
*Assistant Examiner*—Scott Bauer
(74) *Attorney, Agent, or Firm*—Carlson, Gaskey & Olds, PC

(57) ABSTRACT

A system and method for controlling an electronic circuit breaker prevents the circuit breaker from contributing its own delay to a power interruption time window on a load. A monitor coupled to a control processor in the circuit breaker causes the control processor to operate in a low-energy consumption sleep mode if it detects a power interruption. During the sleep mode, the control processor draws current from an energy storage device until the power source is reconnected to the control processor. Because the control processor operation is suspended rather than stopped during the power interruption, the control processor does not need to conduct any preliminary power up operations when power is resumed.

17 Claims, 3 Drawing Sheets

POWER INTERRUPTION SYSTEM FOR ELECTRONIC CIRCUIT BREAKER

TECHNICAL FIELD

The present invention relates to solid state power controllers, and more particularly to a system and method for operating during a power interruption in a solid state power controller.

BACKGROUND OF THE INVENTION

Solid state power controllers (SSPCs) are becoming more common for protecting wiring in an electric power distribution system, like a system on an aircraft. These SSPCs act as electronic circuit breakers and replace traditional mechanical, thermally-activated circuit breakers. Aircraft systems using mechanical circuit breakers require circuit breaker panels with hundreds of circuit breakers around the cockpit, thereby requiring many corresponding wires to connect the circuit breakers to various loads in the aircraft and resulting in a great deal of added weight.

Electronic circuit breakers, by contrast, eliminate most of these wires by using a central electronic display to mimic the circuit breaker panel, locating the electronic circuit breakers themselves close to the loads, and using a high current feeder to connect the power source to the electronic circuit breakers and distribute current to the loads. As a result, an operator can simply press soft buttons on the central electronic display to open and close the electronic circuit breakers and check which ones have tripped. This is more convenient than large circuit breaker panels and simplifies the operator interface for the circuit breakers. Moreover, electronic circuit breakers include a microcontroller and/or a digital signal processor (collectively "intelligence") that can provide many additional functions that are not possible with mechanical circuit breakers, such as arc-fault detection, custom overload control, wire-fault detection, and built-in testing as well as the usual on/off functions.

Electronic circuit breakers, however, operate differently than mechanical circuit breakers because the on/off operation of the electronic circuit breaker is dependent on power reaching the intelligence first before the circuit breaker actually operates. More particularly, a load that is downstream from an electronic circuit breaker will experience a slight delay (e.g., on the order of tens of milliseconds) between the time a power source is connected to the electronic circuit breaker and the time the load senses the power connection because the intelligence needs to first power up and undergo self-testing before it actually turns the circuit breaker on. Mechanical circuit breakers, by contrast, allow the load to respond immediately to power connection because it is normally closed all the time.

This delay does not affect normal operation of the aircraft. However, current aircraft specifications often include a requirement for loads to survive a temporary power interruption for a specified fixed time window (e.g., 200 milliseconds) during fault clearing and bus power transfers. For example, if a generator fails and the loads need to be switched to an alternate power source, the loads are designed to survive the amount of time needed to make the switch. If the load is downstream from an electronic circuit breaker, however, the delay in the circuit breaker caused by waiting for the intelligence to power up will add to the delay caused by the power interruption itself. For example, the intelligence may cause delays by coming out of a reset mode, performing power-up testing, waiting for new commands, and/or determining the circuit breaker state before the power interruption. This may cause the total amount of delay at the load to fall outside the specified time window. In other words, the power interruption at the load will be greater than the power interruption at the power source.

Although this problem may be remedied by simply using a mechanical circuit breaker, which would cause the power interruption at the load to be equal to the power interruption at the source, this is undesirable due to the inherent disadvantages of mechanical circuit breakers noted above.

There is a desire for a system that ensures that a power interruption time period at a load downstream of an electronic circuit breaker will not be greater than a power interruption time at a power source.

SUMMARY OF THE INVENTION

The present invention is directed to a system and method for controlling an electronic circuit breaker to prevent the circuit breaker from contributing its own delay to a power interruption time window for a load. In one embodiment, the system includes an energy storage device coupled between a power source and a power supply for a control processor in the circuit breaker. A monitor coupled to the control processor causes the control processor to operate in a sleep mode if it detects a power interruption. During the interruption, the control processor suspends operation and draws current from the energy storage device until the power source is reconnected. Because the control processor operation is suspended rather than stopped during the power interruption, the control processor does not need to conduct any power up operations when power is resumed.

In one embodiment, the control processor is put into sleep mode and the control outputs are also tri-stated or turned off. The system further includes a small storage device that acts as an energy source to bias a switch element to an ON state, causing the output of the control processor to stay in its current state (on or off) during the power interruption. Using multiple small energy storage devices to supply low current-draw components in the system reduces overall power consumption while still keeping system weight and complexity low.

DETAILED DESCRIPTION OF THE PREFERRED EMBODIMENT

Figure 1:
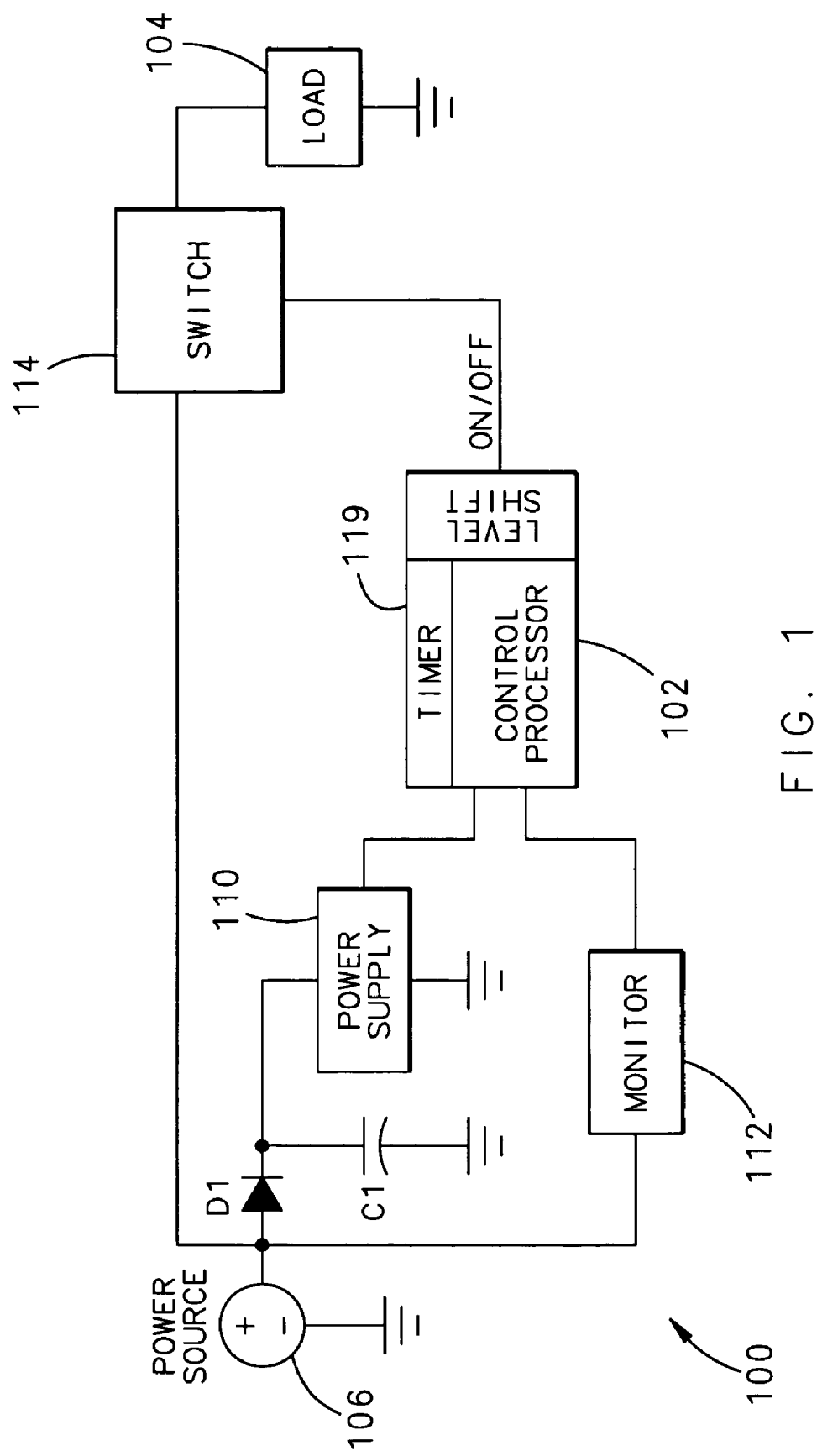
FIG. 1 is a representative functional diagram of an electronic circuit breaker system according to one embodiment of the invention.

FIG. 1 is a representative diagram illustrating a circuit breaker system 100 having one or more electronic circuit breaker control processors 102 that connect and disconnect a load 104 to and from a power source 106. For simplicity, the description below focuses on a system 100 having only one control processor 102, but the system 100 can include multiple control processors 102 without departing from the scope of the invention. The control processor 102 has an ON/OFF output line to command the ON and OFF states of the load 104. Generally, when the ON/OFF output line is high, the load 104 is connected to the power source 106 and is therefore also ON as well, while when the ON/OFF output line is low, the load 104 is disconnected from the power source 106 and is therefore OFF as well.

The system 100 includes a control power supply 110 connected to the control processor 102. The control power supply 110 provides current to the control processor 102. Because the control power supply 110 is also connected to the power source 106, any interruption in the power source 106 will also normally interrupt the control power supply 110 as well.

An energy storage device, such as a capacitor C1, is connected between the power source 106 and the control power supply 110 through a diode D1. The capacitor C1 stores enough energy for the control processor 102 to continue operating normally if a power interruption occurs in the system 100. By maintaining operation of the control processor 102 through the power interruption, the control processor 102 does not cause any delay when the power source 106 is finally reconnected because the control processor 102 does not need to undergo any power up operation. Instead, the control processor 102 simply operates continuously through the power interruption, drawing current from the capacitor C1.

The energy provided by the capacitor C1, however, is finite, and if there is more than one control processor 102 connected to a given power source 106, the size of the capacitor C1 needed to power multiple control processors 102 through a power interruption may be too large and expensive to be practical.

To reduce the capacitance needed to maintain the functional state of the control processor 102 during power interruption, the system 100 reduces the power usage of the control processor 102 by taking advantage of a sleep mode in the control processor 102. As is known in the art, a processor in a sleep mode suspends its operation and remains in a quiescent state until it is released from the sleep mode. Once it is released, the processor resumes operation as if nothing has happened. The energy requirements during the sleep mode are much lower than during normal processor operation, allowing the capacitor C1 to be smaller while still preventing delay in reconnecting the load 104 and the power source 106. In some cases, the control processor 102 may be commanded to periodically come out of the sleep mode to keep the circuit breaker in the ON state, if required.

A monitor 112 is connected to the power source 106 to monitor the voltage applied to the power supply 110. If the voltage drops below a predetermined threshold (e.g., if a voltage drop occurs due to power interruption), the monitor 112 sends a sleep signal to the control processor 102 to place the control processor 102 into sleep mode and suspend its operation. When the monitor 112 detects that the voltage applied to the control processor 102 is above the predetermined threshold (e.g., if reconnection of the power source 106 causes the voltage to rise), the monitor 112 sends a release signal to the control processor 102 to release it from sleep mode.

Because the control processor 102 merely resumes operation when it is released without conducting any power up functions, the control processor 102 does not create any delays between the time the power source 106 is reconnected and the time the load 104 sees the reconnection. In other words, if the control processor 102 output was OFF just before power interruption, it will remain OFF, and if the control processor 102 output was ON, it will remain ON. In either case, the control processor 102 will immediately resume its state before the power interruption, with no power up delays, once it is released from sleep mode.

Note that the ON/OFF output line and any other possible control processor outputs of the control processor 102 (not shown) may be tri-state outputs rather than simple binary outputs to provide further power reduction. In the tri-stated case, the ON/OFF and other outputs may be completely disconnected from the system 100 during the sleep mode so that no current passes through the control processor 102 during the sleep mode.

Figure 2:
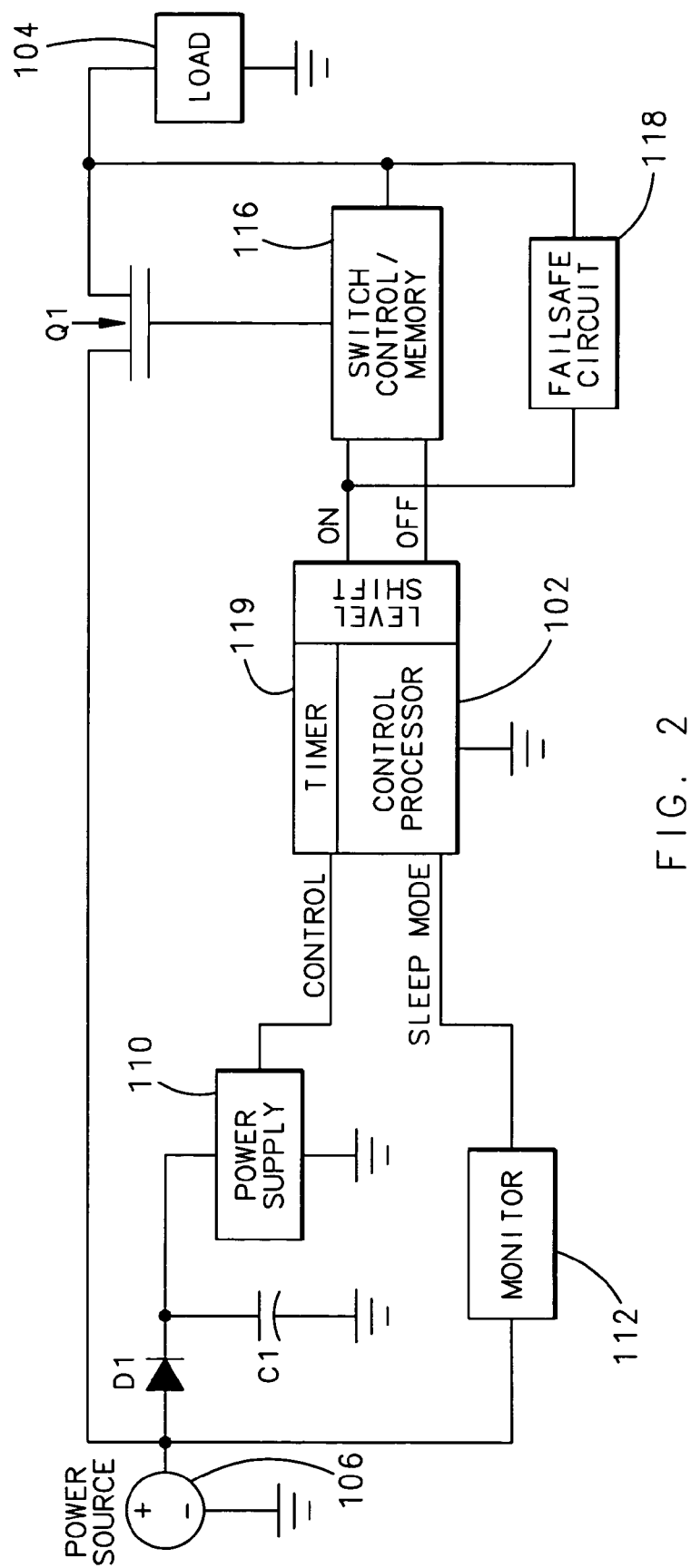
FIG. 2 is a representative functional diagram of a circuit breaker system according to another embodiment of the invention.

Additional circuit devices may be incorporated into the system 100 to provide additional power reduction and/or protection against unacceptable system failure modes. In the example shown in FIGS. 1 through 3, a switch 114, such as a field-effect transistor Q1, is connected to the output of the control processor 102. A memory element, such as a capacitor C2, is connected to the gate of the output transistor Q1 to maintain the output transistor Q1 in an ON or OFF state when the sleep mode is activated in the control processor 102. Note that the capacitor C2 only needs to be large enough to bias the output transistor Q1 to the ON state during sleep mode; if the output transistor Q1 is a field-effect transistor, for example, the capacitor C2 can be very small.

A switch control/memory circuit 116 may be included in the system. The switch control/memory circuit 116 may include a discharge transistor Q2 that is coupled to the capacitor C2 to allow the system 100 to be quickly turned off when commanded and/or if an overcurrent condition requires the output to be turned off. Generally, the discharge transistor Q2 selectively discharges the capacitor C2 when the load is commanded OFF or if there is a potential for an overcurrent condition that could damage wires in the system 100. The switch control/memory circuit 116 may also be commanded by the control processor 102 to periodically recover from a low power state to keep Q1 in an ON state where appropriate.

A failsafe circuit 118 may also be included to ensure that Q1 is switched OFF quickly and safely if the system 100 remains in the sleep mode for an excessive time period. In the example shown in FIG. 3, the failsafe circuit 118 includes a comparator 120 and an RC circuit comprising a resistor R5 and a capacitor C3. C3 is selected so that it discharges faster than C2. When the voltage across C3 drops below a reference voltage of the comparator 120, the output transistor Q1 will be turned off. The reference voltage is selected to ensure that Q1 is never operates in its linear region. Alternatively, a watchdog timer 119 may be included in the control processor 102 and act as an internal failsafe circuit to ensure that Q1 is switched OFF quickly and safely if the system 100 remains in the sleep mode for an excessive time period.

Figure 3:
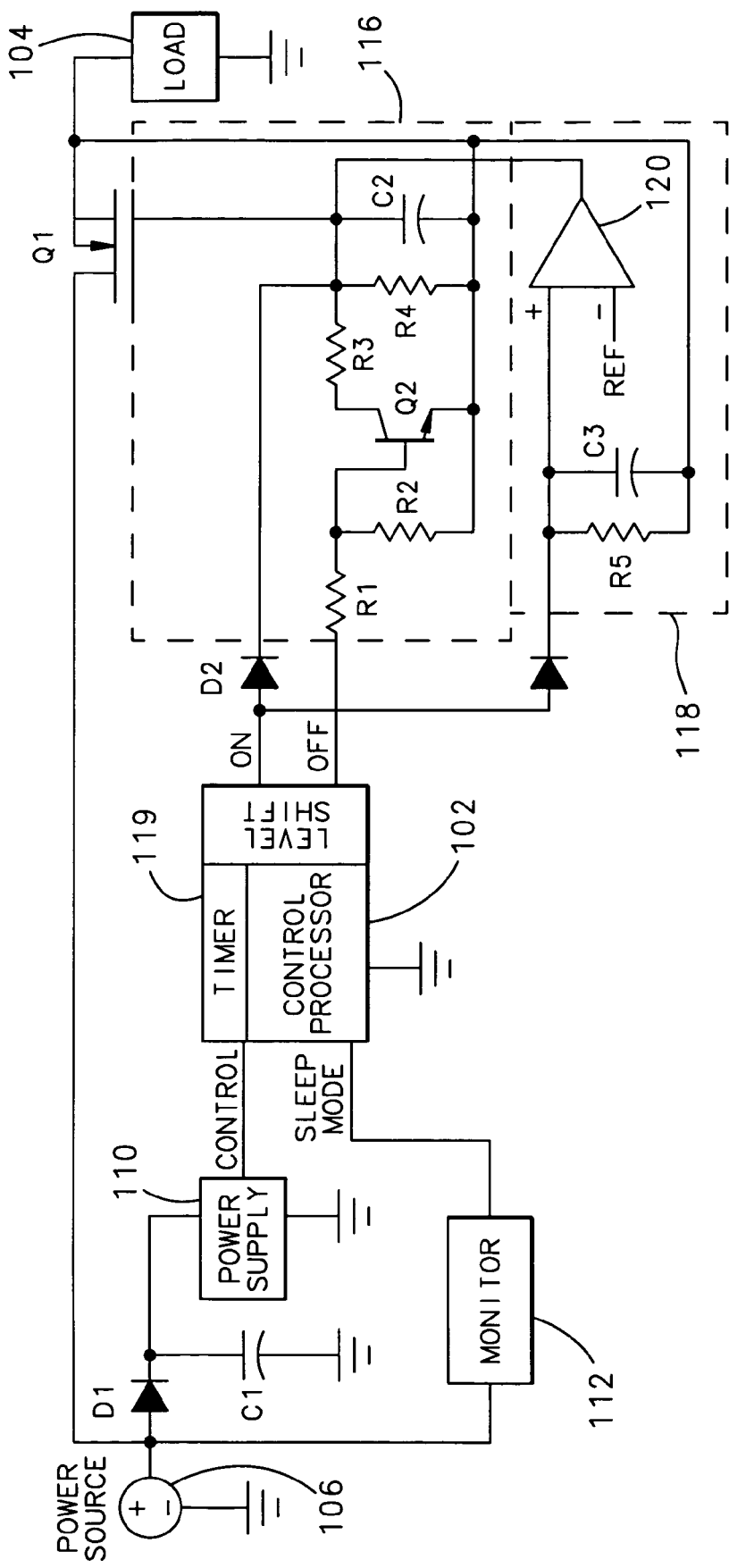
FIG. 3 is a representative functional diagram of the system in FIG. 2 in greater detail.

One possible implementation of the example shown in FIG. 3 will now be described in more detail below.

If the control processor 102 is operating, the ON output of the control processor 102 is low and the OFF output is high, it indicates that the power source 106 is to be disconnected from the load 104 to place the load 104 in an OFF state. The output transistor Q1 connected to the ON output of the control processor 102 will be OFF and the discharge transistor Q2 will be biased ON. The ON state of Q2 will cause capacitor C2 to discharge quickly, thereby maintaining the load 104 in the OFF state as long as the control processor 102 is also in the OFF state.

If the control processor 102 is operating, the ON output of the control processor 102 is high and the OFF output is low, it indicates that the power source 106 is to be connected to the load 104 to place the load 104 in an ON state. The discharge transistor Q2 will be turned off, allowing capacitor C2 to charge. When capacitor C2 charges, it will bias the gate of the output transistor Q1 so that the output transistor Q1 turns on, thereby allowing current to reach the load 104.

If the control processor 102 is in a sleep mode, both the ON output and the OFF output of the control processor 102 are tri-stated or off; that is, they are disconnected from the system 100. As noted above, the control processor 102 is placed in the sleep mode if there is a power interruption. If the load 104 is in an OFF state at the time of the power interruption, the load 104 is maintained in an OFF state until the power source 106 is reconnected. More particularly, in this state the discharge transistor Q2 is off and the capacitor C2 has zero voltage because the previous state of the OFF output of the control processor 102 was high, causing it to discharge quickly. In this operation, the capacitor C2 and a resistor R4 keep the output transistor Q1 biased off by keeping the gate voltage of the transistor Q1 near zero. When the sleep mode is terminated, the ON output of the control processor 102 will resume at a low state and the OFF output will resume at a high state.

If the load 104 is in an ON state at the time of power interruption and when the control processor 102 goes into the sleep mode, the discharge transistor Q2 will be off because it is not receiving any current. However, the capacitor C2 will be charged because the previous state of the ON output was high. The capacitor C2 voltage will bias the gate of the output transistor Q1 so that it remains in an ON state. Thus, when the sleep mode is terminated, the output transistor Q is already biased and will allow current to be supplied instantaneously to the load when the power source 106 is reconnected. In other words, the capacitor C2 acts as a stopgap to maintain the biasing of the output transistor Q1 during the power interruption while the control processor 102 recovers from the interruption, even if the control processor 102 needs extra time to power up (e.g., to allow an internal clock in the control processor 102 to stabilize).

As noted above, the failsafe circuit 118 may be implemented to handle a situation where the control processor 102 stays in the sleep mode for an extended time period when the ON output is initially high. In this case, the voltage of the capacitor C2 will initially bias the output transistor Q1 to the ON state. At the same time, the capacitor C3 in the failsafe circuit also discharges. The values for R5 and C3 are selected so that the time constant of the RC circuit in the failsafe circuit 118 is shorter than the time constant of R4 and C2, thereby causing C3 to discharge faster than C2. Once the voltage of capacitor C3 in the failsafe circuit 118 drops below the reference voltage at the comparator 120, the comparator 120 output goes low, turning off the output transistor Q1. Thus, if the sleep mode circuitry fails, the system 100 will still disconnect the load 104.

Distributing several storage elements, such as capacitors C1, C2, and C3, throughout the system 100 rather than relying on a bulk capacitor to maintain control processor 102 operation during a power interruption greatly reduces the amount of energy needed to maintain system operation during the interruption. Note that although the examples above focus on DC control processor operation, the system is equally effective for AC control processors.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. An electronic circuit breaker, comprising:
   a control power supply connectable to a power source;
   a control processor;
   a switch controllable by the control processor for selectively connecting a load to the power source;
   a monitor separate of the control processor that outputs a sleep mode signal to place the control processor in a sleep mode when a power interruption is detected;
   an energy storage device coupled to the control processor, wherein the energy storage device powers the control processor when the control processor is in the sleep mode; and
   a switch control/memory circuit operatively coupled to at least one output of the control processor, the switch control/memory circuit being controllable by the control processor and coupled to the switch, wherein the switch control/memory circuit periodically recovers from a low power state to keep the switch in an ON state.

2. The electronic circuit breaker of claim 1, wherein the energy storage device is charged by the power source when the control processor is in a normal operation mode.

3. The electronic circuit breaker of claim 2, wherein the energy storage device is a capacitor.

4. The electronic circuit breaker of claim 1, wherein the switch control/memory is internal to the control processor.

5. The electronic circuit breaker of claim 1, wherein the switch control/memory circuit comprises a discharge capacitor and a discharge transistor that discharges the discharge capacitor when the output is to be turned off.

6. The electronic circuit breaker of claim 1, further comprising a failsafe circuit coupled to at least one output of the control processor to turn off said at least one output if the sleep mode lasts for a time period over a selected time threshold.

7. The electronic circuit breaker of claim 6, wherein the failsafe circuit is a watchdog timer internal to the control processor.

8. The electronic circuit breaker of claim 1, wherein the control processor comprises a plurality of control processors, wherein the energy storage device is connected to said plurality of control processors.

9. An electronic circuit breaker, comprising:
   a control power supply connectable to a power source;
   a control processor having an ON output line and an OFF output line, wherein the ON and OFF output lines are tri-stated or off;
   a switch coupled to the ON and OFF output lines for selectively connecting a load to the power source;
   a monitor separate of the control processor that outputs a sleep mode signal to place the control processor in a sleep mode when a power interruption is detected;
   an energy storage device coupled to the power supply, wherein the energy storage device powers the control processor when the control processor is in the sleep mode;
   a switch coupled to the ON and OFF output lines and selectively connectable to a load to control current flow to the load; and
   a switch control/memory circuit coupled to at least one output of the control processor and the switch, the switch control/memory circuit being controllable by the control processor and coupled to the switch, wherein the switch control/memory circuit periodically recovers from a low power state to keep the switch in an ON state.

10. The electronic circuit breaker of claim 9, wherein the energy storage device is a capacitor that is charged by the power source when the control processor is in a normal operation mode.

11. The electronic circuit breaker of claim 9, wherein the switch control/memory circuit comprises a discharge capacitor coupled to the switch and a discharge transistor that discharges the discharge capacitor.

12. The electronic circuit breaker of claim 11, further comprising a failsafe circuit coupled to the control processor and to the switch, the failsafe circuit having
- an RC circuit having a time constant that is less than a time constant of an overcurrent protection circuit; and
- a comparator that compares an output of the RC circuit with a reference, wherein the comparator turns off the switch when the output of the RC circuit drops below the reference.

13. The electronic circuit breaker of claim 9, further comprising a failsafe circuit coupled to at least one output of the control processor to turn off said at least one output if the sleep mode lasts for a time period over a selected time threshold.

14. The electronic circuit breaker of claim 1, wherein the monitor detects a power interruption, and wherein the energy storage device is the only source of power when the control processor has entered sleep mode in response to a power interruption.

15. The electronic circuit breaker of claim 9, wherein the monitor detects a power interruption, wherein the OFF output line is coupled to an output of the control processor and to a switch/control memory circuit, and wherein the ON output line is coupled to an output of the control processor and to a failsafe circuit.

16. The electronic circuit breaker of claim 1, wherein said monitor and said energy storage device communicate along parallel paths to said control processor.

17. The electronic circuit breaker of claim 9, wherein said monitor and said energy storage device communicate along parallel paths to said control processor.

* * * * *

UNITED STATES PATENT AND TRADEMARK OFFICE
CERTIFICATE OF CORRECTION

PATENT NO. : 7,453,678 B2 Page 1 of 1
APPLICATION NO. : 10/924549
DATED : November 18, 2008
INVENTOR(S) : Bruce D. Beneditz et al.

It is certified that error appears in the above-identified patent and that said Letters Patent is hereby corrected as shown below:

On the Title Page:

The Assignee should read as follows:

(73) Assignee: Hamilton Sundstrand Corporation, Rockford, IL (US)

Signed and Sealed this

Twenty-seventh Day of January, 2009

JOHN DOLL
*Acting Director of the United States Patent and Trademark Office*